(12) United States Patent
Kneer

(10) Patent No.: US 7,947,637 B2
(45) Date of Patent: May 24, 2011

(54) CLEANING FORMULATION FOR REMOVING RESIDUES ON SURFACES

(75) Inventor: Emil Kneer, Mesa, AZ (US)

(73) Assignee: Fujifilm Electronic Materials, U.S.A., Inc., North Kingstown, RI (US)

(*) Notice: Subject to any disclaimer, the term of this patent is extended or adjusted under 35 U.S.C. 154(b) by 428 days.

(21) Appl. No.: 11/770,382

(22) Filed: Jun. 28, 2007

(65) Prior Publication Data

US 2008/0004197 A1    Jan. 3, 2008

Related U.S. Application Data

(60) Provisional application No. 60/921,622, filed on Apr. 3, 2007, provisional application No. 60/818,201, filed on Jun. 30, 2006.

(51) Int. Cl.
*C11D 7/50*    (2006.01)

(52) U.S. Cl. .................................. 510/175; 134/1.3

(58) Field of Classification Search ............ 510/175; 134/1.3
See application file for complete search history.

(56) References Cited

U.S. PATENT DOCUMENTS

| | | | |
|---|---|---|---|
| 5,691,117 A | 11/1997 | Lutsic et al. | |
| 5,756,824 A | 5/1998 | Landscheidt et al. | |
| 6,083,840 A | 7/2000 | Mravic | |
| 6,326,130 B1 * | 12/2001 | Schwartzkopf et al. | 430/329 |
| 6,361,712 B1 | 3/2002 | Honda | |
| 6,436,832 B1 | 8/2002 | Ma et al. | |
| 6,443,814 B1 | 9/2002 | Miller et al. | |
| 6,447,693 B1 | 9/2002 | Pryor | |
| 6,455,432 B1 | 9/2002 | Tsai et al. | |
| 6,517,413 B1 | 2/2003 | Hu et al. | |
| 6,524,950 B1 | 2/2003 | Lin | |
| 6,749,998 B2 * | 6/2004 | Schwartzkopf et al. | 430/329 |
| 6,773,873 B2 * | 8/2004 | Seijo et al. | 430/329 |
| 7,572,758 B2 * | 8/2009 | Shimada et al. | 510/175 |
| 2002/0037479 A1 * | 3/2002 | Schwartzkopf et al. | 430/329 |
| 2003/0096500 A1 | 5/2003 | Kneer | |
| 2003/0181342 A1 * | 9/2003 | Seijo et al. | 510/175 |
| 2004/0147420 A1 | 7/2004 | Zhou et al. | |
| 2006/0040838 A1 * | 2/2006 | Shimada et al. | 510/175 |
| 2006/0293208 A1 * | 12/2006 | Egbe et al. | 510/407 |
| 2008/0169004 A1 * | 7/2008 | Wu | 134/2 |

OTHER PUBLICATIONS

International Search Report and Written Opinion of PCT/US07/15169.
Extended European Search Report issued on Jul. 15, 2010 in EP Application No. 97810054.2.

* cited by examiner

*Primary Examiner* — Gregory E Webb
(74) *Attorney, Agent, or Firm* — Fish & Richardson P.C.

(57) ABSTRACT

The present disclosure provides a non-corrosive cleaning composition that is useful for removing residues from a semiconductor substrate. The composition can comprise water, at least one hydrazinocarboxylic acid ester, at least one water soluble carboxylic acid, optionally, at least one fluoride-containing compound, and, optionally, at least one corrosion inhibitor not containing a carboxyl group. The present disclosure also provides a method of cleaning residues from a semiconductor substrate using the non-corrosive cleaning composition.

34 Claims, No Drawings

CLEANING FORMULATION FOR REMOVING RESIDUES ON SURFACES

CROSS-REFERENCE TO RELATED APPLICATIONS

The present application claims priority to U.S. Provisional Application Nos. 60/921,622, filed on Apr. 3, 2007, and 60/818,201, filed on Jun. 30, 2006.

BACKGROUND

1. Field of the Disclosure

The present disclosure relates to a novel cleaning composition for semiconductor substrates and a method of cleaning semiconductor substrates. More particularly, the present disclosure relates to a cleaning composition for removing plasma etch residues formed on semiconductor substrates after plasma etching of metal layers or dielectric material layers deposited on the substrates and the removal of residues left on the substrate after a chemical mechanical polishing process.

2. Discussion of the Background Art

In the manufacture of integrated circuit devices, photoresists are used as an intermediate mask for transferring the original mask pattern of a reticle onto the wafer substrate by means of a series of photolithography and plasma etching steps. One of the essential steps in the integrated circuit device manufacturing process is the removal of the patterned photoresist films from the wafer substrate. In general, this step is carried out by one of two methods.

One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly crosslinked by such treatments and are more difficult to dissolve in the stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate in a process known as plasma ashing. However, plasma ashing is also not fully effective in removing the plasma etching by-products noted above. Instead removal of these plasma etch by-products must be accomplished by subsequently exposing the processed metal and dielectric thin films to certain cleaning solutions.

Metal substrates are generally susceptible to corrosion. For example, substrates such as aluminum, copper, aluminum-copper alloy, tungsten nitride, and other metals and metal nitrides will readily corrode by using conventional cleaning chemistries. In addition the amount of corrosion tolerated by the integrated circuit device manufacturers is getting smaller and smaller as the device geometries shrink.

Hydroxylamine and hydroxylammonium salts are known to have excellent cleaning capabilities for residue removal on semiconductor substrates. However, recent reports have raised concerns toward the safe use of those materials and as a result there is a push by the semiconductor industry to replace hydroxylamine type components. Hence there is a need for more environmentally friendly materials.

Therefore, the cleaning solution must be effective for removing the plasma etch residues and must also be non-corrosive to all exposed substrate materials. The ability to clean the broad range of residues encountered, and be non-corrosive to exposed substrate materials is achieved by using the cleaning composition of the present disclosure. The cleaning composition of the present disclosure effectively cleans a semiconductor substrate without corroding metals contained thereon because of its weak acidic formulation, and due to the presence of combinations of water soluble organic compounds which act to enhance residue cleaning performance via oxidation and reduction mechanisms, and also whose presence performs the dual function of corrosion inhibition and trace metal chelation.

SUMMARY OF THE DISCLOSURE

The present disclosure is directed to a non-corrosive cleaning composition that is useful primarily for removing plasma etch and/or plasma ashing residues from a semiconductor substrate as an intermediate step in a multistep manufacturing process. These residues include a range of relatively insoluble mixtures of organic compounds like residual photoresist, organometallic compounds, metal oxides which are formed as reaction by-products from exposed metals such as copper, titanium, tantalum, tungsten, cobalt, metal nitrides such as titanium and tungsten nitride, and other materials.

One embodiment of the non-corrosive cleaning composition of the present disclosure comprises water, at least one water soluble hydrazinocarboxylic acid ester, at least one water soluble carboxylic acid, optionally, at least one water soluble fluoride-containing material; and optionally, at least one corrosion inhibitor not containing carboxyl groups.

Another embodiment of the non-corrosive cleaning composition comprises: water; at least one water soluble hydrazinocarboxylic acid ester selected from the group consisting of: methyl carbazate, ethyl carbazate, tert-butyl carbazate, and benzyl carbazate; at least one water soluble carboxylic acid selected from the group consisting of: monocarboxylic acids with one additional ligand, monocarboxylic acids with two or more additional ligands, and polycarboxylic acids with additional ligands; at least one water soluble fluoride-containing material selected from the group consisting of: tetramethylammonium fluoride, tetrabutylammonium fluoride, or trimethylethyl ammonium fluoride; and optionally, at least one corrosion inhibitor not containing carboxyl groups.

A third embodiment of the non-corrosive cleaning composition comprises: water; about 0.01 wt % to about 15 wt % of at least one water soluble hydrazinocarboxylic acid ester; about 0.01 wt % to about 20 wt % of at least one water soluble carboxylic acid; about 0.0005 wt % to about 5 wt % of at least one water soluble fluoride-containing material; and optionally, at least one corrosion inhibitor not containing carboxyl groups.

The present disclosure also provides a method of cleaning residues from a semiconductor substrate. The method comprising the steps of: providing a semiconductor substrate; contacting said semiconductor substrate with a cleaning composition, said cleaning composition comprising water, at least one hydrazinocarboxylic acid ester, at least one water soluble carboxylic acid, optionally, at least one fluoride-containing compound, and, optionally, at least one corrosion inhibitor not containing a carboxyl group; rinsing said semiconductor substrate with a suitable rinse solvent; and, optionally, drying said semiconductor by any means that removes the rinse solvent and does not compromise the integrity of said semiconductor substrate.

In a second embodiment of the method of cleaning residues from a semiconductor substrate, the method comprising the steps of: providing a semiconductor substrate; contacting said semiconductor substrate with a cleaning composition; rinsing said semiconductor substrate with a suitable rinse solvent; and optionally, drying said semiconductor by any means that removes the rinse solvent and does not compromise the integrity of said semiconductor substrate. The cleaning composition of this second embodiment comprises: water; at least one water soluble hydrazinocarboxylic acid ester selected from the group consisting of: methyl carbazate, ethyl carbazate, tert-butyl carbazate, and benzyl carbazate; at least one water soluble carboxylic acid selected from the group consisting of: monocarboxylic acids with one additional ligand, monocarboxylic acids with two or more additional ligands, and polycarboxylic acids with additional ligands; at least one water soluble fluoride-containing material selected from the group consisting of: tetramethylammonium fluoride, tetrabutylammonium fluoride or trimethylethyl ammonium fluoride, at least one hydrazinocarboxylic acid ester, and optionally, at least one corrosion inhibitor not containing a carboxyl group.

DETAILED DESCRIPTION OF THE PREFERRED EMBODIMENT

As defined herein unless otherwise noted, all percentages expressed should be understood to be percentages by weight to the total weight of the cleaning composition. A "solvent" is meant to be any material that is capable to dissolve the components of the cleaning composition at ambient temperature. Unless otherwise noted, ambient temperature is defined to be between about 16 and about 27 degrees Celsius (° C.).

The present disclosure is directed to a non-corrosive cleaning composition primarily useful for removing plasma etch and/or plasma ashing residues from a semiconductor substrate comprising: (A) water; (B) at least one water soluble hydrazinocarboxylic acid ester; (C) at least one water soluble carboxylic acid; and (D) optionally, at least one corrosion inhibitor not containing a carboxyl group. The pH of the cleaning composition is between about 2 to about 6.

The present disclosure comprises as a key component at least one water soluble hydrazinocarboxylic acid ester (also known as carbazic acid ester or carbazate), which is thought to function as a selective oxidation/reduction agent to improve the dissolution rate of a broad range of otherwise relatively insoluble plasma etch residues. The hydrazinocarboxylic acid ester facilitates the removal of plasma etch residues and is non-corrosive to metals. Hydrazinocarboxylic acid esters employed in the cleaning compositions of the present disclosure are described by formula (I):

$$R^1\text{—O—CO—NH—NH}_2 \quad (I)$$

in which $R^1$ is an optionally substituted, straight-chain or branched $C_1$-$C_{20}$ alkyl group, an optionally substituted $C_3$-$C_{20}$ cycloalkyl group, or an optionally substituted $C_6$-$C_{14}$ aryl group. Examples of $R^1$ groups include, but are not limited to, methyl, trifluoromethyl, ethyl, 2,2,2-trifluoroethyl, 2,2,2,-trichloroethyl, hydroxyethyl, propyl, iso-propyl, cyclopropyl, n-butyl, iso-butyl, tert-butyl, sec-butyl, cyclobutyl, pentyl, 1-hydroxypentyl, iso-pentyl, neo-pentyl, cyclopentyl, hexyl, cyclohexyl, heptyl, cyclohexylmethyl, cycloheptyl, 2-cyclohexylethyl, octyl, decyl, pentadecyl, eicosyl, benzyl, and phenyl.

Preferably $R^1$ is an optionally substituted, straight-chain or branched $C_1$-$C_{10}$ alkyl group or an optionally substituted $C_3$-$C_{10}$ cycloalkyl group. Examples of preferred $R^1$ groups include, but are not limited to, methyl, trifluoromethyl, ethyl, 2,2,2-trifluoroethyl, 2,2,2,-trichloroethyl, hydroxyethyl, propyl, iso-propyl, cyclopropyl, n-butyl, iso-butyl, tert-butyl, sec-butyl, cyclobutyl, pentyl, 1-hydroxypentyl, iso-pentyl, neo-pentyl, cyclopentyl, hexyl, cyclohexyl, heptyl, cyclohexylmethyl, cycloheptyl, 2-cyclohexylethyl, octyl, decyl and benzyl.

More preferably $R^1$ is an optionally phenyl substituted, straight-chain or branched $C_1$-$C_5$ alkyl group or a $C_3$-$C_6$ cycloalkyl group. Examples of more preferred $R^1$ groups include, but are not limited to, methyl, ethyl, propyl, iso-propyl, cyclopropyl, n-butyl, iso-butyl, tert-butyl, sec-butyl, cyclobutyl, pentyl, iso-pentyl, neo-pentyl, cyclopentyl, cyclohexyl and benzyl. Most preferably $R^1$ is a methyl, ethyl, tert-butyl or benzyl group.

Examples of suitable hydrazinocarboxylic acid esters include, but are not limited to, methyl carbazate, ethyl carbazate, propyl carbazate, iso-propyl carbazate, butyl carbazate, tert-butyl carbazate, pentyl carbazate, decyl carbazate, pentadecyl carbazate, eicosyl carbazate, benzyl carbazate, phenyl carbazate and 2-hydroxyethyl carbazate. Preferred examples of hydrazinocarboxylic acid esters include, but are not limited to, methyl carbazate, ethyl carbazate, propyl carbazate, iso-propyl carbazate, butyl carbazate, tert-butyl carbazate, pentyl carbazate, decyl carbazate, 2-hydroxyethyl carbazate, and benzyl carbazate. More preferred examples of hydrazinocarboxylic acid esters include, but are not limited to, methyl carbazate, ethyl carbazate, propyl carbazate, iso-propyl carbazate, butyl carbazate, tert-butyl carbazate, pentyl carbazate and benzyl carbazate. Methyl carbazate, ethyl carbazate, tert-butyl carbazate and benzyl carbazate are the most preferred hydrazinocarboxylic acid esters.

The hydrazinocarboxylic acid esters may be a blend of two or more hydrazinocarboxylic acid esters. If such is the case, then the hydrazinocarboxylic acid esters may be blended in any ratio up to about 99 wt % of one compound. In a binary mixture, a preferred mixture would contain up to about 95 wt % of one compound. A more preferred binary mixture would contain up to about 75 wt % of one compound. A most preferred binary mixture would contain up to about 50 wt % of each compound. In a ternary or higher mixture, the hydrazinocarboxylic acid esters could be mixed in any suitable ratio.

Hydrazinocarboxylic acid esters can be purchased commercially or prepared by a process described in U.S. Pat. No. 5,756,824, incorporated herein by reference in its entirety.

The present disclosure further comprises at least one water soluble carboxylic acid. The addition of the carboxylic acid to the aqueous composition within a preferred weight range will fix the pH of the composition at an acidic pH, thus making an acidic aqueous composition wherein important metal oxides, such as oxides of copper and aluminum (and their alloys), are rapidly dissolved based on thermodynamic equilibrium. The carboxylic acid in the present disclosure has several beneficial functions which include: 1) enhancement of the residue dissolution properties of the composition, 2) adjustment of the pH of the solution with a high buffering capacity, 3) increased corrosion resistance via formation of organometallic chelated species on clean exposed metal surfaces may be provided, and/or 4) chelation and capture capability of unwanted trace metal contaminates that otherwise redeposit back onto the surface of the semiconductor substrate may be provided.

A principle benefit for including certain water soluble carboxylic acids in the cleaning composition of the present disclosure is their ability to provide metal chelating functionality. The chelating agent in the present disclosure is thought to reduce metal corrosion. Chelating agents are compounds that can form multiple bonds to a single metal ion. The metal cation will be called the central atom, and the anions or molecules with which it forms a coordination compound will be referred to as ligands. If the ligand is composed of several atoms, the one responsible for the basic or nucleophilic nature of the ligand is called the ligand atom. If a base contains more than one ligand atom, and thus can occupy more than one coordination position in the complex, it is referred to as a multidentate complex former. Ligands occupying one, two, three, and so on, positions are referred to as unidentate, bidentate, tridentate, and so on. Complex formation with multidentate ligands is called chelation, and the complexes are called chelates. Compounds containing groups such as hydroxyl, amino, thio, mercapto, carboxyl and carbonyl groups can have metal chelating properties. Carboxylic acids, especially those containing hydroxyl groups, can effectively inhibit metal corrosion of aluminum, copper, alloys of aluminum and copper, titanium, tantalum, tungsten, and other exposed metals and intermetallic materials, such as metal nitrides.

In the description of subclasses of water soluble carboxylic acids in the following paragraphs, substituents with a nitrogen or a sulfur atom are not contemplated unless otherwise specified.

In one embodiment of the cleaning composition of the present disclosure the at least one water soluble carboxylic acid comprises at least one monocarboxylic acid without additional ligands. Examples of this subclass of carboxylic acid include, but are not limited to, acetic, formic, butyric, propionic, benzoic, acrylic, valeric, isovaleric, trimethyl acetic acid and mixtures thereof.

In another embodiment of the cleaning composition of the present disclosure the at least one water soluble carboxylic acid comprises at least one monocarboxylic acid with one additional ligand. Examples of this subclass of carboxylic acid include, but are not limited to, pyruvic, lactic, glycolic, mandelic, acetoxyacetic, 3-hydroxybutyric, 2-hydroxyisobutryic, 2-ketobutyric acid and mixtures thereof.

In another embodiment of the cleaning composition of the present disclosure the at least one water soluble carboxylic acid comprises at least one monocarboxylic acid with two or more additional ligands. Examples of this subclass of carboxylic acid include, but are not limited to, glyceric, gluconic, galacturonic acid and mixtures thereof.

In another embodiment of the cleaning composition of the present disclosure the at least one water soluble carboxylic acid comprises at least one dicarboxylic acid without additional ligands. Examples of these carboxylic acids include, but are not limited to, oxalic, malonic, maleic, fumaric, methyl malonic, succinic, methyl succinic, diglycolic, methyl maleic, pimelic, phthalic, suberic, glutaric acid and mixtures thereof.

In yet another embodiment of the cleaning composition of the present disclosure the at least one water soluble carboxylic acid comprises at least one dicarboxylic acid with one additional ligand. Examples of this subclass of carboxylic acid include, but are not limited to, malic, oxalacetic, citramalic, ketoglutaric acid and mixtures thereof.

In yet another embodiment of the cleaning composition of the present disclosure the at least one water soluble carboxylic acid comprises at least one dicarboxylic acid with two or more additional ligands. Examples of this subclass of carboxylic acid include, but are not limited to, tartaric, dihydroxyfumaric, saccharic acid and mixtures thereof.

In another embodiment of the cleaning composition of the present disclosure the at least one water soluble carboxylic acid comprises at least one compound with more than two carboxylic acid groups (polycarboxylic acid) without any additional ligands. Examples of this subclass of carboxylic acid include, but are not limited to, tricarballylic, trimesic, trimellitic acid and mixtures thereof.

In another embodiment of the cleaning composition of the present disclosure the at least one water soluble carboxylic acid comprises at least one polycarboxylic acid with additional ligands. Examples of this subclass of carboxylic acid include, but are not limited to, citric acid, agaric acid and mixtures thereof.

In another embodiment of the cleaning composition of the present disclosure the at least one water soluble carboxylic acid comprises at least one monocarboxylic acid with at least one nitrogen moiety. Examples of this subclass of carboxylic acid include, but are not limited to, glycine, trycine, N-ethylglycine, alanine, sarcosine, 3-aminobutyric acid, pyrrole-2-carboxylic acid, serine, homoserine, asparagine, threonine, creatine, oxamic, guanidineacetic, 2,3-diaminopropionic, maleamic, succinamic, aminoorotic acid, 5-amino-pyrazole-4-carboxylic acid, 5-nitro-pyrazole-3-carboxylic acid, 2-imidazolidone-4-carboxylic acid, 4-amino-2-hydroxybutyric acid, 3-aminopyrazine-2-carboxylic acid, pyrazine-2-carboxylic acid and mixtures thereof. Preferred examples of this subclass of carboxylic acid are serine, homoserine, asparagine, threonine, creatine, oxamic, guanidineacetic, 2,3-diaminopropionic, maleamic, succinamic, aminoorotic acid, 5-amino-pyrazole-4-carboxylic acid, 5-nitro-pyrazole-3-carboxylic acid, 2-imidazolidone-4-carboxylic acid, 4-amino-2-hydroxybutyric acid, 3-aminopyrazine-2-carboxylic acid, pyrazine-2-carboxylic acid and mixtures thereof. More preferred examples of this subclass of carboxylic acid are serine, homoserine, threonine, 4-amino-2-hydroxybutyric acid and mixtures thereof.

In another embodiment of the cleaning composition of the present disclosure the at least one water soluble carboxylic acid comprises at least one dicarboxylic acid or polycarboxylic acid each having at least one nitrogen moiety. Examples of this subclass of carboxylic acid include, but are not limited to, ethylenediaminetetraacetic acid, N-(2-hydroxyethyl)ethylenediamine-N,N',N'-triacetic acid, 5H-diethylenetriaminepentaacetic acid, 1-Amino-cis-cyclopentane-1,3-dicarboxylic acid and mixtures thereof.

In another embodiment of the cleaning composition of the present disclosure the at least one water soluble carboxylic acid comprises at least one monocarboxylic acid with at least one sulfur moiety. Examples of this subclass of carboxylic acid include, but are not limited to, thiolactic, thiophenecarboxylic, mercaptopropionic mercaptopyruvic, sulfosuccinic, mercaptosuccinic, thiodiglycolic acid and mixtures thereof. Preferred examples of this subclass of carboxylic acid are sulfosuccinic, mercaptosuccinic, thiodiglycolic acid and mixtures thereof. More preferred examples of this subclass of carboxylic acid are mercaptosuccinic, thiodiglycolic acid and mixtures thereof.

In another embodiment of the cleaning composition of the present disclosure the at least one water soluble carboxylic acid comprises at least one monocarboxylic acid with at least one sulfur moiety and at least one nitrogen moiety. Examples of this subclass of carboxylic acid include, but are not limited to, cysteic acid, homocysteic acid, cysteine, thiazolidine carboxylic acid, homocysteine, cystine and mixtures thereof. Preferred examples of this subclass of carboxylic acid are cysteine, thiazolidine carboxylic acid, homocysteine, cystine and mixtures thereof. The more preferred example of this subclass of carboxylic acid is cystine.

The preferred classes of the at least one water soluble carboxylic acid are monocarboxylic acid with one additional ligand, monocarboxylic acid with two or more additional ligands, dicarboxylic acid without additional ligands, dicarboxylic acid with one additional ligand, dicarboxylic acid with two or more additional ligands, polycarboxylic acid without additional ligands, polycarboxylic acid with additional ligands, monocarboxylic acid with at least one nitrogen moiety, and dicarboxylic acid or polycarboxylic acid with at least one nitrogen moiety.

The more preferred classes of the at least one water soluble carboxylic acid are monocarboxylic acid with one additional ligand, monocarboxylic acid with two or more additional ligands, dicarboxylic acid without additional ligands, dicarboxylic acid with one additional ligand, dicarboxylic acid with two or more additional ligands, polycarboxylic acid with additional ligands and monocarboxylic acid with at least one nitrogen moiety.

The most preferred classes of the at least one water soluble carboxylic acid are monocarboxylic acid with one additional ligand, monocarboxylic acid with two or more additional ligands, dicarboxylic acid without additional ligands, polycarboxylic acid with additional ligands and monocarboxylic acid with at least one nitrogen moiety.

The water soluble carboxylic acid added to the cleaning composition of the present disclosure may be a blend of two or more carboxylic acids. If such is the case, then the carboxylic acid may be blended in any ratio up to about 99.5 wt % of one acid. In a binary mixture, a preferred mixture would contain up to about 95 wt % of one acid. A more preferred binary mixture would contain up to about 80 wt % of one acid. A most preferred binary mixture would contain up to about 50 wt % of each acid. In a ternary or higher mixture, the carboxylic acid could be mixed in any suitable ratio.

The present disclosure further comprises water. Preferably, the water is de-ionized and ultra-pure, containing no organic contaminants. Preferably, the water has a minimum resistivity of about 4 to about 17 mega Ohms. More preferably, the resistivity of the water is at least 17 mega Ohms.

The present disclosure comprises the mixture resulting from blending (A) water; (B) at least one water soluble hydrazinocarboxylic acid ester; (C) at least one water soluble carboxylic acid; and (D) optionally at least one corrosion inhibitor not containing a carboxyl group.

The water soluble hydrazinocarboxylic acid ester is present in the cleaning composition of the present disclosure in the range from between about 0.01 wt % to about 15 wt %. Preferably, there is about 0.05 wt % to about 10 wt % of the hydrazinocarboxylic acid ester in the cleaning composition. More preferably, the hydrazinocarboxylic acid ester is added to the cleaning composition in the amount of 0.1 wt % to 7.5 wt %. The most preferred range for the hydrazinocarboxylic acid ester is from about 0.1 wt % to about 5 wt %.

The water soluble carboxylic acid is added in an amount between about 0.01 wt % to about 20 wt % in the cleaning composition of the present disclosure. Preferably, about 0.05 wt % to about 15 wt %, and more preferably about 0.1 wt % to about 10 wt % of the water soluble carboxylic acid is included in the cleaning composition. The most preferred concentration range of the carboxylic acid in the cleaning composition is between about 0.1 wt % and 6 wt %.

The cleaning composition of the present disclosure may, optionally, include one or more corrosion inhibitors not containing carboxyl groups. These corrosion inhibitors can be added to the composition to reduce and inhibit corrosion of exposed metal layers on the semiconductor device, such as aluminum, copper, alloys of these metals, and other exposed metals. There are two mechanisms in which these compounds aid to inhibit corrosion: 1) they may contain ligands other than carboxyl groups, such as, hydroxyl, amino, thio, mercapto, and carbonyl groups and, therefore, have chelating properties, and 2) they may have antioxidant properties and prevent the formation of metal oxides. The addition of one or more of these optional corrosion inhibitors may also improve the cleaning response.

Corrosion inhibitors not containing carboxyl groups useful in the compositions of the present disclosure, include but are not limited to, the following: ascorbic acid, vanillin, uric acid, butyne diols, benzotriazole, triazole, glucose, imidazole, 2-butyne-1,4-diol, ketones such as cyclohexenyl acetone and 3-nonene-2-one, tetramisole, hydrazine and its derivatives, such as, methyl, ethyl, propyl, hydroxymethyl, hydroxyethyl, hydroxypropyl, dihydroxyethyl, methoxy, maleic and phenyl hydrazine, oximes such as acetone oxime, salicylaldoxime and butanone oxime, readily oxidized aromatic compounds and oxidation inhibitors, such as, hydroquinone, pyrogallol, hydroxytoluene, 4-methoxyphenyl, and 4-hydroxymethylphenol, thiols such as mercaptoethanol, 2-propene-1-thiol, thioglycerol, 1H-1,2,4-triazole-3-thiol, mercaptomethyl imidazole, mercaptothiazoline, 2-mercapto-4[3H]quinazoline and 2-thiobarbituric acid, aldehydes and derivatives thereof, such as salicylaldehyde, and 4-hydroxybenzaldehyde, glycol aldehyde dialkyl acetals, particularly glycol aldehyde diethyl acetal and mixtures thereof.

If employed in the cleaning composition of the present disclosure, the corrosion inhibitors, are added from about 0.001 wt % to about 15 wt %. A more preferred concentration range of the corrosion inhibitors is from about 0.005 wt % to about 10 wt %, and more preferably about 0.01 wt % to about 8 wt %. The most preferred concentration range of the corrosion inhibitor is between about 0.01 wt % to about 6 wt % in the present disclosure.

In one embodiment of the present disclosure, the cleaning composition for removing plasma etch and/or plasma ashing residues formed on a semiconductor substrate comprises:
(a) water;
(b) about 0.01 wt % to about 15 wt % of at least one water soluble hydrazinocarboxylic acid ester of formula (1) in which $R^1$ is an optionally substituted, straight-chain or branched $C_1$-$C_{20}$ alkyl group, optionally substituted $C_3$-$C_{20}$ cycloalkyl group, or optionally substituted $C_6$-$C_{14}$ aryl group;
(c) about 0.01 wt % to about 20 wt % of at least one water soluble carboxylic acid; and
(d) optionally, about 0.001 wt % to about 15 wt % of at least one corrosion inhibitor not containing a carboxyl group.

In a preferred embodiment of the present disclosure, the cleaning composition for removing plasma etch and/or plasma ashing residues formed on a semiconductor substrate comprises:
(a) water;
(b) about 0.05 wt % to about 10 wt % of at least one water soluble hydrazinocarboxylic acid ester of formula (1) in which $R^1$ is an optionally substituted, straight-chain or branched $C_1$-$C_{10}$ alkyl group or optionally substituted $C_3$-$C_{10}$ cycloalkyl group;
(c) about 0.05 wt % to about 15 wt % of at least one water soluble carboxylic acid selected from monocarboxylic acid with one additional ligand, monocarboxylic acid with two or more additional ligands, dicarboxylic acid without additional ligands, dicarboxylic acid with one additional ligand, dicarboxylic acid with two or more additional ligands, polycarboxylic acid without additional ligands, polycarboxylic acid with additional ligands, monocarboxylic acid with at least one nitrogen moiety, and dicarboxylic acid or polycarboxylic acid with at least one nitrogen moiety; and (d) optionally, about 0.005 to about 10% of at least one corrosion inhibitor not containing a carboxyl group.

In a more preferred embodiment of the present disclosure, the cleaning composition for removing plasma etch and/or plasma ashing residues formed on a semiconductor substrate comprises:

(a) water;
(b) about 0.1 wt % to about 7.5 wt % of at least one water soluble hydrazinocarboxylic acid ester of formula (1) in which $R^1$ is a straight-chain or branched $C_1$-$C_5$ alkyl group or $C_3$-$C_5$ cycloalkyl group;
(c) about 0.1 wt % to about 10 wt % of at least one water soluble carboxylic acid selected from the group consisting of monocarboxylic acid with one additional ligand, monocarboxylic acid with two or more additional ligands, dicarboxylic acid with one additional ligand, dicarboxylic acid with two or more additional ligand and polycarboxylic acids with additional ligands; and
(d) optionally, about 0.01 wt % to about 8 wt % of at least one corrosion inhibitor not containing a carboxyl group.

In the most preferred embodiment of the present disclosure, the cleaning composition for removing plasma etch and/or plasma ashing residues formed on a semiconductor substrate comprises:

(a) water;
(b) about 0.1 wt % to about 5 wt % of at least one water soluble hydrazinocarboxylic acid ester of formula (1) in which $R^1$ is a methyl or ethyl group;
(c) about 0.1 wt % to about 6 wt % of at least one water soluble carboxylic acid selected from the group consisting of monocarboxylic acids with one additional ligand, monocarboxylic acids with two or more additional ligands and polycarboxylic acids with additional ligands; and
(d) optionally, about 0.01 wt % to about 6 wt % of at least one corrosion inhibitor not containing a carboxyl group.

In addition, additives such as, pH adjusting agents, surfactants, chelating agents not containing a carboxyl group, defoaming agents, and biocides may be included as optional components.

The cleaning composition of the present disclosure may, optionally, include one or more pH adjusting agents. The pH adjusting agent is employed if necessary to adjust the composition to fall within a pH range from about 2 to about 6. A preferred pH range is from about 2 to about 5. A more preferred pH range is from about 2 to about 4. The most preferred range of pH is from about 2.2 to about 3.5. Examples of classes of pH adjusting agents useful for the present disclosure include, but are not limited to, hydroxylamines, alkanolamines, alkylamines and alkyl ammonium hydroxides. Examples of suitable pH adjusting agents include, but are not limited to, hydroxylamine, diethylhydroxylamine, monoethanolamine, diethanolamine, triethanolamine, diethyleneglycolamine, N-hydroxyethylpiperazine, monomethylamine, dimethylamine, trimethylamine, monoethylamine, diethylamine, ethylmethylamine, isopropylamine, diisopropylamine, mono-n-propylamine, mono-n-butylamine, cyclohexylamine, N,N-dimethyl-1,3-popanediamine, N,N-dimethylcyclohexylamine, furfurylamine, tetramethylammonium hydroxide, tetraethylammonium hydroxide, trimethyl hydroxyethylammonium hydroxide and methyl tri(hydroxyethyl)ammonium hydroxide.

A surfactant may also be optionally included in the cleaning composition of the present disclosure so as to promote even wetting of the semiconductor surface and enhance the power of the plasma etching residue dissolution and removal from the semiconductor substrate. These surfactants can be nonionic, cationic, anionic, zwitterionic, or amphoteric surfactants or mixtures thereof. Preferably, surfactants for the present disclosure have low levels of metallic impurities. An example is an alkylphenol polyglycidol ether type of a nonionic surfactant, available from Arch Chemicals Inc. under the trade name OHS. If added, the surfactant is present in the cleaning composition of the present disclosure up to about 0.5 wt % (5000 parts per million). Preferably, the surfactant of the present disclosure is in the cleaning composition from about 0.0005 wt % (5 ppm) to about 0.22 wt % (2200 ppm). More preferably, the surfactant of the present disclosure is in the cleaning composition from about 0.001 wt % (10 ppm) to about 0.1 wt % (1000 ppm). The most preferred surfactant concentration in the cleaning composition of the present disclosure is between about 0.001 wt % (10 ppm) to about 0.05 wt % (500 ppm).

The cleaning composition of the present disclosure may further include additives that are designed to reduce foaming. If employed, the antifoaming agent may be employed up to about 20 wt % of the total surfactant concentration. Examples of defoamers, which may be suitable, include, but are not limited to, DeFoamer WB 500 (available from Tech Sales Co.), NoFoam 1971(available from Oil Chem Technology), Tego Foaqmex (available from DeGusa), Surfynol 104 (available from Air-Products), SAG 10 (available from OSi Specialties, Inc.), and Advantage 831 (available from Hercules).

The cleaning composition of the present disclosure may also include antimicrobial additives (e.g., bactericides, algicides or fungicides). Examples of antimicrobial agents which might be employed include, but are not limited to, Kathon CG, Kathon CG II, and NEOLONE 950 Bactericide (available from Rohm and Haas), methylisothiazolinone, and the AQUCAR series of products (available from Dow Chemical). If employed in the cleaning composition, the typical range of concentration of antimicrobial agent would be from about 0.0001 wt % to about 0.5 wt %.

As the present disclosure is useful in integrated circuit device manufacturing processes, care must be taken to provide cleaning compositions with low metallic impurities. Preferably, the cleaning compositions of the present disclosure should not exceed total metal ion contamination levels of 10 ppm. More preferred are cleaning compositions that have total metal ion contamination levels of 5 ppm or less. Most preferred are cleaning compositions that have total metal ion contamination levels not exceeding 1 ppm.

An example of a cleaning composition of the present disclosure comprises (a) water;
(b) about 0.1 wt % to about 7.5 wt % of methyl carbazate; and
(c) about 0.1 wt % to about 10 wt % of a 3:1 mixture by weight of citric acid and lactic acid.

Another example of a cleaning composition of the present disclosure comprises (a) water;
(b) about 0.1 wt % to about 5 wt % of methyl carbazate;
(c) about 0.1 wt % to about 6 wt % of a 1:1 mixture by weight of citric acid and lactic acid; and
(d) optionally, about 0.01 wt % to about 6 wt % ascorbic acid.

Another example of a cleaning composition of the present disclosure comprises
(a) water;
(b) about 0.1 wt % to about 7.5 wt % of a 1:1 mixture by weight of methyl carbazate and ethyl carbazate;
(c) about 0.1 wt % to about 10 wt % of citric acid; and
(d) about 10 ppm to 1000 ppm non-ionic surfactant.

Another example of a cleaning composition of the present disclosure comprises
(a) water;
(b) about 0.05 wt % to about 10 wt % of ethyl carbazate;
(c) about 0.05 wt % to about 15 wt % of lactic acid; and
(d) a sufficient amount of tetramethylammonium hydroxide to adjust the pH of the composition to be in the range from about 2 to about 5.

Another example of a cleaning composition of the present disclosure comprises
(a) water;
(b) about 0.1 wt % to about 5 wt % of tert-butyl carbazate;
(c) about 0.1 wt % to about 6 wt % of a 1:3 mixture by weight of citric acid and lactic acid; and
(d) a sufficient amount of tetramethylammonium hydroxide to adjust the pH of the composition to be in the range from about 2.2 to about 3.5.

Another example of a cleaning composition of the present disclosure comprises
(a) water;
(b) about 0.01 wt % to about 15 wt % of methyl carbazate;
(c) about 0.01 wt % to about 20 wt % of a 4:1 mixture by weight of citric acid and D-gluconic acid; and
(d) optionally, about 0.001 wt % to about 15 wt % maleic hydrazine.
(e) a sufficient amount of tetramethylammonium hydroxide to adjust the pH of the composition to be in the range from about 2 to about 6.

The cleaning composition of the present disclosure is not specifically designed to remove photoresist films from semiconductor substrates. Rather the cleaning composition of the present disclosure is designed to remove plasma etch residue after removing the photoresist by a dry or wet stripping method from the semiconductor substrate.

Therefore, the cleaning method of the present disclosure is preferably preceded by a photoresist stripping process. Any suitable dry stripping process can be used, including $O_2$ plasma ashing, ozone gas phase-treatment, fluorine plasma treatment, hot $H_2$ gas treatment (described in U.S. Pat. No. 5,691,117 incorporated herein by reference in its entirety), and the like. In addition any conventional organic wet stripping solution can be used known to a person skilled in the art.

The preferred stripping process used in combination with the cleaning method of the present disclosure is a dry stripping process. Preferably this dry stripping process is the $O_2$ plasma ashing process. This process removes most of the photoresist from the semiconductor substrate by applying a reactive-oxygen atmosphere at elevated temperatures (typically 250° C.) at vacuum conditions (i.e. 1 torr). Organic materials are oxidized by this process and are removed with the process gas. However, this process does not remove inorganic or organometallic contamination for the semiconductor substrate. A subsequent cleaning of the semiconductor substrate with the cleaning composition of the present disclosure is necessary to remove those residues.

One embodiment of the present disclosure is the method of cleaning residues from a semiconductor substrate comprising the steps of:
(a) providing a semiconductor substrate containing post etch and/or post ash residues;
(b) contacting said semiconductor substrate with a cleaning composition comprising: water, at least one water soluble hydrazinocarboxylic acid ester, at least one water soluble carboxylic acid, and, optionally, at least one corrosion inhibitor not containing a carboxyl group;
(c) rinsing said semiconductor substrate with a suitable rinse solvent; and
(d) optionally, drying said semiconductor substrate by any means that removes the rinse solvent and does not compromise the integrity of said semiconductor substrate.

In addition, the cleaning composition used in step (b) of the method of the present disclosure can optionally contain additional additives, such as pH adjusting agents, surfactants, chelating agents not containing a carboxyl group, de-foaming agents, and biocides.

The semiconductor substrates to be cleaned in this method contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, and silicon, titanium nitride, tantalum nitride, and tungsten. Said semiconductor substrate may also contain layers of silicon oxide, silicon nitride, silicon carbide and carbon doped silicon oxides.

The semiconductor substrate can be contacted with the cleaning composition by any suitable method, such as by placing the cleaning composition into a tank and immersing and/or submerging the semiconductor substrates into the cleaning composition, spraying the cleaning composition onto the semiconductor substrate, streaming the cleaning composition onto the semiconductor substrate, or any combinations thereof. Preferably, the semiconductor substrates are immersed into the cleaning composition.

The cleaning compositions of the present disclosure may be effectively used up to a temperature of about 90° C. Preferably, the cleaning composition is used from about 16° C. to about 70° C. More preferably the cleaning composition is employed in the temperature range from about 18° C. to about 50° C. An advantage of the cleaning compositions of the present disclosure is that they may be effectively used at ambient temperature.

Similarly, cleaning times can vary over a wide range depending on the particular cleaning method employed. When cleaning in an immersion batch type process, a suitable range is, for example, up to about 60 minutes. A preferred range for a batch type process is from about 2 minutes to about 40 minutes. A more preferred range for a batch type process is from about 3 minutes to about 30 minutes. A most preferred range for a batch type cleaning process is from about 3 minutes to about 20 minutes.

Cleaning times for a single wafer process may range from about 10 seconds to about 5 minutes. A preferred cleaning time for a single wafer process may range from about 15 seconds to about 4 minutes. A more preferred cleaning time for a single wafer process may range from about 15 seconds to about 3 minutes. A most preferred cleaning time for a single wafer process may range from about 20 seconds to about 2 minutes.

To further promote the cleaning ability of the cleaning composition of the present disclosure, mechanical agitation means may be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground may be at any angle. Horizontal or vertical orientations are preferred.

The cleaning compositions of the present disclosure can be used in conventional cleaning tools, such as the Ontrak Systems DSS, SEZ single wafer spray rinse system, Verteq single wafer megasonic Goldfinger, Semitool Millenium single wafer spray rinse systems, and other toolsets. A significant advantage of the composition of the present disclosure is that it is comprised of relatively non-toxic, non-corrosive, and non-reactive components in whole and in part, whereby the composition is highly stable in a wide range of temperatures and process times. The composition of the present disclosure is chemically compatible with practically all materials used to construct existing and proposed semiconductor wafer cleaning process tools for batch and single wafer cleaning.

Subsequent to the cleaning, the semiconductor substrate is rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Preferred examples of rinse solvents include, but are not limited to, DI water, methanol, ethanol and isopropyl alcohol. More preferred rinse solvents are DI water and isopropyl alcohol. The most preferred rinse solvent is DI water. The solvent may be applied using means similar to that used in applying the cleaning composition. The cleaning composition may have been removed from the semiconductor substrate prior to the start of the rinsing step or it may still be in contact with the semiconductor substrate at the start of the rinsing step. Preferably, the temperature employed is between 16° C. and 27° C.

Optionally, the semiconductor substrate is then dried. Any suitable drying means known in the art may be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

The present disclosure is also directed to a non-corrosive post CMP cleaning method useful for removing slurry and metallic particulates and other residual organic and metal oxide residues on copper and low k dielectric substrates which have been subjected to chemical mechanical polishing. Any suitable chemical mechanical polishing process may be employed. Examples of suitable chemical mechanical polishing process can be found in U.S. Pat. Nos. 6,083,840, 6,517, 413, 6,524,950, 6,447,693, and 6443814, herein incorporated by reference in their entireties, and references therein.

Between the chemical mechanical polishing and the cleaning step, there may be optional steps in which the polished substrate may be pre-cleaned with a buffing step such as disclosed in U.S. Pat. Nos. 6,455,432 and 6,436,832 (where are incorporated by reference in their entireties) or a suitable solvent with or without an agitation means to remove residual slurry particles and other contaminants. Examples of suitable solvents include de-ionized water and alcohols. The substrate may be dried using a drying means or proceed directly to be cleaned.

One embodiment of the present disclosure is the method of cleaning semiconductor substrates containing post CMP residues comprising the steps of:
 (1) providing a semiconductor substrate containing post CMP residues;
 (2) contacting said semiconductor substrate with a cleaning composition comprising: water, at least one water soluble hydrazinocarboxylic acid ester, at least one water soluble carboxylic acid, and, optionally, at least one corrosion inhibitor not containing a carboxyl group;
 (3) rinsing said semiconductor substrate with a suitable rinse solvent; and
 (4) optionally, drying said semiconductor substrate by any means that removes the rinse solvent and does not compromise the integrity of said semiconductor substrate.

In addition, the cleaning composition used in step (b) of the method of the present disclosure can optionally contain additional additives, such as pH adjusting agents, surfactants, chelating agents not containing a carboxyl group, de-foaming agents, and biocides.

Post CMP residue contains residuals left behind from the CMP slurry, employed in the chemical mechanical polishing process, such as abrasive particles, as well as residual materials removed from the surface of the semiconductor substrate. Those substrates may contain metal interconnects such as copper lines inlayed in a low dielectric constant material or multiple layer stacks of non-conducting ceramic like composite materials, such as HDP oxide, TEOS, silicon carbide, carbon doped silicon oxide and organic polymers. Examples of carbon doped silicon oxides include, but are not limited to, Coral (Novellus), Black Diamond I and Black Diamond II (Applied Materials), Aurora (ASM International), and Orion (Trikon Industries). Examples of organic polymers used as low k dielectrics include, but are not limited to, bisbenzocyclobutene (Dow Chemical), polyarylene ethers (FLARE from Allied Signal), and SiLK (Dow Chemical). Surfaces of other metals and semiconductor materials such as Ta, TaN, TiN, TiW, or other metallic oxide, silicide, and nitride materials may also be present. The copper components may be entirely copper or copper alloy material.

The cleaning composition of the present disclosure may be brought into contact with the substrate to be cleaned in any suitable manner such as by spray, immersion, or stream and may be delivered to the substrate through nozzles, hoses, pipes, brushes or equivalent means. To assist cleaning, mechanical agitation means may be employed. Examples of suitable agitation means include circulation of cleaner over the surface, streaming or spraying the cleaner over the surface, ultrasonic or megasonic agitation, or brushing. Brushing and megasonic agitation are preferred. The orientation of the substrate relative to the ground may be at any angle. Horizontal or vertical orientations are preferred. Contact time may be from about 15 seconds to about 120 seconds. Preferred contact times are from about 15 seconds to about 60 seconds. The temperature at which cleaning takes place is not critical, although cleaning results may vary with temperature. The preferred temperature range is from about 16° C. to about 27° C.

Subsequent to exposure to the cleaning composition of the present disclosure, the substrate may be rinsed with a suitable rinse solvent for about 5 seconds to about 120 seconds with or without agitation means. Examples of suitable rinse solvents include, but are not limited to, DI water, methanol, ethanol, isopropyl alcohol, and propylene glycol monomethyl ether acetate. Preferred examples of rinse solvents include, but are not limited to, DI water, methanol, ethanol and isopropyl alcohol. More preferred rinse solvents are DI water, and isopropyl alcohol. The most preferred rinse solvent is DI water. The rinse solvent may be applied using means similar to that used in applying the cleaning composition. The cleaning solution may have been removed from the substrate prior to the start of the rinsing step or it may still be in contact with the substrate at the start of the rinsing step. In a preferred embodiment, the substrate is rinsed without previously removing the cleaning composition for about 10 seconds to about 30 seconds with agitation means, followed by rinsing for about 20 seconds to about 90 seconds without agitation means. The temperature of the rinsing step may be any temperature suitable for the processing equipment below the boiling point the rinse solvent. Preferably, the temperature employed is between 16° C. and 27° C.

The substrate is then dried. Any suitable drying means known in the art may be employed. Examples of suitable drying means include spin drying, flowing a dry gas across the substrate, or heating the substrate with a heating means such as a hotplate or infrared lamp, or combinations thereof. Drying times will be dependent on the specific method employed but are typically on the order of 30 seconds up to several minutes.

The chemical make-up of the residue on semiconductor substrates after post etch and/or ashing processes depends on the etch or ashing process employed as well as the types of materials exposed to those processes. The cleaning composition may have to be tailored to certain species of residue or substrate.

Another embodiment of the present disclosure, therefore, is a non-corrosive fluoride-containing cleaning composition primarily useful for removing plasma etching and/or plasma ashing residues from a semiconductor substrate comprising: (A) water; (B) at least one water soluble hydrazinocarboxylic acid ester; (C) at least one water soluble carboxylic acid; (D) at least one water soluble fluoride-containing material; and, optionally, (E) at least one corrosion inhibitor not containing a carboxyl group. The pH of the fluoride-containing cleaning composition is between about 2 to about 6.

Components A, B, C, and the optional at least one corrosion inhibitor not containing a carboxyl group employed in this embodiment are as described above and are present in the fluoride-containing cleaning composition in concentrations as described above.

This embodiment of the present disclosure further comprises at least one water soluble fluoride-containing material. The presence of this fluoride-containing material in the fluoride-containing cleaning composition is essential for the removal of some types of post ash or post etch residue from the substrate. This type of post ash or post etch residue typically includes a complex mixture of relatively insoluble metal oxides or metal silicates. It has been found that in order to achieve good residue dissolution within a short process time window, the presence of a component capable of dissociating a free fluoride anion in the range of 100 to 10000 ppm is advantageous in the fluoride-containing cleaning composition of the present disclosure.

Typical water soluble fluoride-containing materials useful in the present disclosure include, but are not limited to, ammonium salts such as ammonium fluoride, alkylammonium fluoride or fluoride salts of aliphatic primary, secondary, and tertiary amines reacted with HF, metal salts such as antimony (III/VI) fluoride, barium fluoride, tin (II) fluoride or aluminum (III) fluoride, fluoroborate compounds, hydrofluoric acid and mixtures thereof. Preferably, these fluoride-containing materials are metal ion free. More preferred fluoride-containing materials are ammonium fluoride and tetraalkylammonium fluorides. The most preferred fluoride-containing materials are unsubstituted tetraalkylammonium fluorides.

Examples of fluoride-containing materials are ammonium fluoride, tetramethylammonium fluoride, tetraethylammonium fluoride, tetrabutylammonium fluoride, methylammonium fluoride, dimethylammonium fluoride, trimethylethyl ammonium fluoride, triethanolammonium fluoride, ethanolammonium fluoride, methanolammonium fluoride, trimethanolammonium fluoride, methyldiethanolammonium fluoride, diglycolammonium fluoride, ammonium hydrogen difluoride, ammonium tetrafluoroborate, sodium tetrafluoroborate, antimony (III/VI) fluoride, barium fluoride, tin (II) fluoride or aluminum (III) fluoride. Preferred examples of fluoride-containing materials are ammonium fluoride, tetramethylammonium fluoride, tetraethylammonium fluoride, tetrabutylammonium fluoride, methylammonium fluoride, dimethylammonium fluoride, trimethylethyl ammonium fluoride, trimethylethanolammonium fluoride, triethanolammonium fluoride, ethanolammonium fluoride, methanolammonium fluoride, trimethanolammonium fluoride, methyldiethanolammonium fluoride, digrycolammonium fluoride, ammonium hydrogen difluoride or ammonium tetrafluoroborate. More preferred examples of fluoride-containing materials are ammonium fluoride, tetramethylammonium fluoride, tetraethylammonium fluoride, tetrabutylammonium fluoride or trimethylethyl ammonium fluoride, or trimethylethanolammonium fluoride. Examples of the most preferred fluoride-containing materials are tetramethylammonium fluoride, tetraethylammonium fluoride, tetrabutylammonium fluoride or trimethylethyl ammonium fluoride.

The water soluble fluoride-containing material is conveniently added in an amount between about 0.0005 wt % (5 ppm) to about 5.0 wt % (50000 ppm). Preferably, about 0.005 wt % (50 ppm) to about 3.0 wt % (30000 ppm), and more preferably about 0.01 wt % (100 ppm) to about 2.0 wt % (20000 ppm) of the fluoride-containing material is included in the fluoride-containing cleaning composition. The most preferred concentration range of the fluoride-containing material in the fluoride-containing cleaning composition is between about 0.05 wt % (500 ppm) and 1.5 wt % (15000 ppm).

The present disclosure comprises the mixture resulting from blending (A) water; (B) at least one water soluble hydrazinocarboxylic acid ester; (C) at least one water soluble carboxylic acid; (D) a water soluble fluoride-containing material; and, optionally, (E) at least one corrosion inhibitor not containing a carboxyl group.

In one embodiment of the present disclosure, the fluoride-containing cleaning composition for removing plasma etch and/or plasma ashing residues formed on a semiconductor substrate comprises:
  (a) water;
  (b) about 0.01 wt % to about 15 wt % of at least one water soluble hydrazinocarboxylic acid ester of formula (1) in which $R^1$ is an optionally substituted, straight-chain or branched $C_1$-$C_{20}$ alkyl group, optionally substituted $C_3$-$C_{20}$ cycloalkyl group, or optionally substituted $C_6$-$C_{14}$ aryl group;
  (c) about 0.01 wt % to about 20 wt % of at least one water soluble carboxylic acid;
  (d) about 0.0005 wt % to about 5 wt % of the fluoride-containing material; and
  (e) optionally, about 0.001 wt % to about 15 wt % of at least one corrosion inhibitor not containing a carboxyl group.

In a preferred embodiment of the present disclosure, the fluoride-containing cleaning composition for removing plasma etch and/or plasma ashing residues formed on a semiconductor substrate comprises:
- (a) water;
- (b) about 0.05 wt % to about 10 wt % of at least one water soluble hydrazinocarboxylic acid ester of formula (1) in which $R^1$ is an optionally substituted, straight-chain or branched $C_1$-$C_{10}$ alkyl group or optionally substituted $C_3$-$C_{10}$ cycloalkyl group;
- (c) about 0.05 wt % to about 15 wt % of at least one water soluble carboxylic acid selected from monocarboxylic acid with one additional ligand, monocarboxylic acid with two or more additional ligands, dicarboxylic acid without additional ligands, dicarboxylic acid with one additional ligand, dicarboxylic acid with two or more additional ligands, polycarboxylic acid without additional ligands, polycarboxylic acid with additional ligands, monocarboxylic acid with at least one nitrogen moiety, and dicarboxylic acid or polycarboxylic acid with at least one nitrogen moiety;
- (d) about 0.005 wt % to about 3 wt % of the fluoride-containing material; and
- (e) optionally, about 0.005 to about 10% of at least one corrosion inhibitor not containing a carboxyl group.

In a more preferred embodiment of the present disclosure, the fluoride-containing cleaning composition for removing plasma etch and/or plasma ashing residues formed on a semiconductor substrate comprises:
- (a) water;
- (b) about 0.1 wt % to about 7.5 wt % of at least one water soluble hydrazinocarboxylic acid ester of formula (1) in which $R^1$ is a straight-chain or branched $C_1$-$C_5$ alkyl group or $C_3$-$C_5$ cycloalkyl group;
- (c) about 0.1 wt % to about 10 wt % of at least one water soluble carboxylic acid selected from the group consisting of monocarboxylic acid with one additional ligand, monocarboxylic acid with two or more additional ligands, dicarboxylic acid with one additional ligand, dicarboxylic acid with two or more additional ligand and polycarboxylic acids with additional ligands;
- (d) about 0.01 wt % to about 2 wt % of the fluoride-containing material; and
- (e) optionally, about 0.01 wt % to about 8 wt % of at least one corrosion inhibitor not containing a carboxyl group.

In the most preferred embodiment of the present disclosure, the fluoride-containing cleaning composition for removing plasma etch and/or plasma ashing residues formed on a semiconductor substrate comprises:
- (a) water;
- (b) about 0.1 wt % to about 5 wt % of at least one water soluble hydrazinocarboxylic acid ester of formula (1) in which $R^1$ is a methyl or ethyl group;
- (c) about 0.1 wt % to about 6 wt % of at least one water soluble carboxylic acid selected from the group consisting of monocarboxylic acids with one additional ligand, monocarboxylic acids with two or more additional ligands and polycarboxylic acids with additional ligands;
- (d) about 0.05 wt % to about 1.5 wt % of the fluoride-containing material; and
- (e) optionally, about 0.01 wt % to about 6 wt % of at least one corrosion inhibitor not containing a carboxyl group.

The fluoride-containing cleaning compositions of the present disclosure may, optionally, include one or more pH adjusting agents, one or more surfactants, one or more foam reducing agents and/or one or more antimicrobial additives, all of which are described above.

As the present disclosure is useful in integrated circuit device manufacturing processes, care must be taken to provide fluoride-containing cleaning compositions with low metallic impurities. Preferably, the fluoride-containing cleaning compositions of the present disclosure should not exceed total metal ion contamination levels of 10 ppm. More preferred are fluoride-containing cleaning compositions that have total metal ion contamination levels of 5 ppm or less. Most preferred are fluoride-containing cleaning compositions that have total metal ion contamination levels not exceeding 1 ppm.

An example of a fluoride-containing cleaning composition of the present disclosure comprises:
- (a) water;
- (b) about 0.1 wt % to about 7.5 wt % of methyl carbazate;
- (c) about 0.1 wt % to about 10 wt % of a 3:1 mixture by weight of citric acid and lactic acid.
- (d) about 0.001 wt % to about 3 wt % of tetramethylammonium fluoride; and Another example of a fluoride-containing cleaning composition of the present disclosure comprises
- (a) water;
- (b) about 0.1 wt % to about 5 wt % of methyl carbazate;
- (c) about 0.1 wt % to about 6 wt % of a 1:1 mixture by weight of citric acid and lactic acid;
- (d) about 0.001 wt % to about 3 wt % of ammonium fluoride; and
- (e) optionally, about 0.01 wt % to about 6 wt % ascorbic acid.

Another example of a fluoride-containing cleaning composition of the present disclosure comprises
- (a) water;
- (b) about 0.1 wt % to about 7.5 wt % of a 1:1 mixture by weight of methyl carbazate and ethyl carbazate;
- (c) about 0.1 wt % to about 10 wt % of citric acid;
- (d) about 0.01 wt % to about 2 wt % of tetramethylammonium fluoride; and
- (e) about 10 ppm to 1000 ppm non-ionic surfactant.

Another example of a fluoride-containing cleaning composition of the present disclosure comprises
- (a) water;
- (b) about 0.05 wt % to about 10 wt % of ethyl carbazate;
- (c) about 0.05 wt % to about 15 wt % of lactic acid;
- (d) about 0.01 wt % to about 2 wt % of tetramethylammonium fluoride; and
- (e) a sufficient amount of tetramethylammonium hydroxide to adjust the pH of the fluoride-containing cleaning composition to be in the range from about 2 to about 5.

Another example of a fluoride-containing cleaning composition of the present disclosure comprises
- (a) water;
- (b) about 0.1 wt % to about 5 wt % of tert-butyl carbazate;
- (c) about 0.1 wt % to about 6 wt % of a 1:3 mixture by weight of citric acid and lactic acid;
- (d) about 0.001 wt % to about 3 wt % of tetraethylammonium fluoride; and
- (e) a sufficient amount of tetramethylammonium hydroxide to adjust the pH of the fluoride-containing cleaning composition to be in the range from about 2.2 to about 3.5.

Another example of a fluoride-containing cleaning composition of the present disclosure comprises
- (a) water;
- (b) about 0.01 wt % to about 15 wt % of methyl carbazate;
- (c) about 0.01 wt % to about 20 wt % of a 4:1 mixture by weight of citric acid and D-gluconic acid;

(d) about 0.001 wt % to about 3 wt % of a 1:1 molar mixture of tetramethylammonium hydroxide and HF; and (e) optionally, about 0.001 wt % to about 15 wt % maleic hydrazine.

The fluoride-containing cleaning composition of the present disclosure is not specifically designed to remove photoresist films from semiconductor substrates. Rather the fluoride-containing cleaning composition of the present disclosure is designed to remove plasma etch and/or plasma ashing residues after removing the photoresist by a dry or wet stripping method from the semiconductor substrate.

Therefore, the cleaning method of the present disclosure is preferably preceded by a photoresist stripping process. Suitable stripping processes are as described above.

Another embodiment of the present disclosures is the method of cleaning residues from a semiconductor substrate comprising the steps of:

(a) providing a semiconductor substrate containing post etch and/or post ash residues;

(b) contacting said semiconductor substrate with a fluoride-containing cleaning composition comprising: (A) water; (B) at least one water soluble hydrazinocarboxylic acid ester; (C) at least one water soluble carboxylic acid; (D) a water soluble fluoride-containing material; and (E) optionally, at least one corrosion inhibitor not containing a carboxyl group.

(c) rinsing said semiconductor substrate with a suitable rinse solvent; and (d) optionally, drying said semiconductor substrate by any means that removes the rinse solvent and does not compromise the integrity of said semiconductor substrate.

In addition, the fluoride-containing cleaning composition used in step (b) of the method of the present disclosure can optionally contain additional additives, such as pH adjusting agents, surfactants, chelating agents not containing a carboxyl group, de-foaming agents, and biocides.

The semiconductor substrates to be cleaned in this method may contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, copper, titanium, tantalum, cobalt, silicon, titanium nitride, tantalum nitride, and tungsten. Said semiconductor substrate may also contain layers of silicon oxide, silicon nitride, silicon carbide and carbon doped silicon oxides.

The processing in steps b, c, and d are as described above.

The present disclosure is also directed to another non-corrosive post CMP cleaning method useful for removing slurry and metallic particulates and other residual organic and metal oxide residues on copper and low k dielectric substrates which have been subjected to chemical mechanical polishing. Suitable chemical mechanical polishing process including an optional buffing step, both preceding the post CMP residue, cleaning, are as described above.

Another embodiment of the present disclosure is the method of cleaning semiconductor substrates containing post CMP residues comprising the steps of:

(1) providing a semiconductor substrate containing post CMP residues;

(2) contacting said semiconductor substrate with a fluoride-containing cleaning composition comprising: (A) water; (B) at least one water soluble hydrazinocarboxylic acid ester; (C) at least one water soluble carboxylic acid; (D) a water soluble fluoride-containing material; and (E) optionally, at least one corrosion inhibitor not containing a carboxyl group;

(3) rinsing said semiconductor substrate with a suitable rinse solvent; and (4) optionally, drying said semiconductor substrate by any means that removes the rinse solvent and does not compromise the integrity of said semiconductor substrate.

In addition, the fluoride-containing cleaning composition used in step (b) of the method of the present disclosure can optionally contain additional additives, such as pH adjusting agents, surfactants, chelating agents not containing a carboxyl group, de-foaming agents, and biocides.

Suitable substrates and processing in steps 2, 3 and optionally 4 are as described above.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a stir bar at 200 rpm unless otherwise noted.

General Procedure 1

Formulation Blending 1000 g of the cleaning compositions were prepared by first fully dissolving the carboxylic acid(s) into ultra pure deionized water (DI water). Then the oxidizing/reducing agents (i.e. hydrazinocarboxylic acid ester, hydroxyammonium sulfate and optional corrosion inhibitor) were added and fully dissolved. At this point the pH adjusting agent, if used, was added and fully dissolved. Any other additives, if used, were added last. The pH measurements were taken at ambient temperature after all components were fully dissolved. All components used were commercially available and of high purity.

General Procedure 2

Formulation Blending

Fluoride-containing cleaning compositions were prepared by first fully dissolving the carboxylic acid(s) into ultra pure deionized water (DI water). Then the oxidizing/reducing agents (i.e. hydrazinocarboxylic acid ester, hydrolxyammonium sulfate and optional corrosion inhibitor) were added and fully dissolved. Then the fluoride-containing material was added and fully dissolved. Then the nonionic surfactant (OHS) was added and fully dissolved. At this point the pH adjusting agent, if used, was added and fully dissolved. The pH measurements were taken at ambient temperature after all components were fully dissolved. All components used were commercially available and of high purity.

General Procedure 3

Electrochemical Measurement

Electrochemical data were obtained using an EG&G PARC 263A potentiostat/galvanostat. The electrochemical test cell had a solution volume of about 120 ml. All testing was carried out maintaining controlled stirring and temperature setting. The electrochemical test cell used a saturated calomel reference electrode having a potential of +242 mV with respect to the Standard Hydrogen Electrode (SHE), and a platinum counter electrode. 200 mm silicon wafer substrates containing either an (a) $Si/SiO_2/Ta/Cu$ thin film stack or (b) $Si/SiO_2/Ti/Al$-4% Cu alloy thin film stack were diced into 1.5 cm width by 5 cm length test coupons using a diamond scribe. The Cu or Al-4% Cu metal films which were exposed to the test solutions as the working electrode surface had a film thickness of at least 1 um, but no greater than 1.5 μm. The working electrode area was 0.33 cm² for all tests. The copper and aluminum test coupons were pretreated using a dilute acidic solution dip for about 30 seconds followed by a brief DI water rinse prior to testing to remove any native oxides, leaving a bare metal test surface. All test coupon areas were masked from exposure to the test solution except for the working electrode area, and a dry frontside metal electrical contact point. The test coupons were immersed vertically into the test solutions so that the working electrode area was fully exposed to the test solution, while the upper portion of the test coupon remained in air as a dry electrical contact. Tests were conducted by measuring samples using a sequence of 1) open circuit potential measurement to establish stability at rest potential ($E_{corr}$), 2) linear polarization sweep at +/−20 mV from rest potential at a fixed scan rate, and 3) Tafel polarization at +/−250 mV from rest potential at 5 mV/sec scan rate. Copper and aluminum etch rates were calculated using Faraday's law from the corrosion current density (μA/cm²) as calculated from the Stern-Geary equation using the Tafel slopes (βa and βc), the polarization resistance (Rp), and the working electrode surface area (see M. Stern and A. L. Geary, Electrochemical Polarization, Journal of the Electrochemical Society, Vol. 104, #1, January 1957, p. 56). Electrochemical etch rates were accurately correlated with both physical weight loss measurements, and also Inductive Coupled Plasma (ICP) measurements.

Corrosion ranking of cleaning compositions was done on a 1-10 scale with 10 being best. Cu etch rates of greater than or equal to 5 Å/min were deemed unacceptable. Cu etch rates of less than or equal to 1 Å/min at were considered good. Etch rates of less than or equal to 0.5 Å/min were considered excellent. See Table 1 for ranking definition.

TABLE 1

Corrosion Ranking Definition

| Cu etch rate [Å/min] | Cu Corrosion Ranking |
|---|---|
| >5 | 1 |
| >4-</=5 | 2 |
| >3.5-</=4 | 3 |
| >3.0-</=3.5 | 4 |
| >2.5-</=3.0 | 5 |
| >2.0-</=2.5 | 6 |
| >1.5-</=2.0 | 7 |
| >1-</=1.5 | 8 |
| >0.5-</=1 | 9 |
| </=0.5 | 10 |

Examples 1-4 and Comparative Examples 1-3

Examples 1-4 and Comparative Examples 1-3 were prepared using General Procedure 1 with cleaning compositions as listed in Table 2.

TABLE 2

Composition and pH of Examples 1-4 and Comparative Examples 1-3

| Solution Component | Examples 1-4 | | | | Comparative Examples 1-3 | | |
|---|---|---|---|---|---|---|---|
| | E1 | E2 | E3 | E4 | C1 | C2 | C3 |
| Citric Acid | 40 g | 40 g | 10 g | 10 g | 40 g | 40 g | 10 g |
| Lactic Acid | 11.1 g | 11.1 g | 11.1 g | 11.1 g | 11.1 g | 11.1 g | 11.1 g |
| Me-Carb | 10 g | 10 g | 10 g | | | | |
| Et-Carb | | | | 10 g | | | |
| HAS | | | | | 2.3 g | 2.3 g | 2.3 g |
| Ascorbic Acid | | 10 g | 10 g | 10 g | | 10 g | 10 g |
| TMAH | | | | | | 1.9 g | |
| OHS | | | | | 0.1 g | 0.01 g | |
| DI water | 938.9 g | 928.9 g | 958.9 g | 958.9 g | 946.5 g | 934.7 g | 966.6 g |
| pH (@ 18° C.) | 2.71 | 2.68 | 3.19 | 3.18 | 2.00 | 2.12 | 2.20 |

Note 1:
Me-Carb = Methyl Carbazate;
Et-Carb = Ethyl Carbazate;
HAS = Hydroxylammonium sulfate;
TMAH = Tetramethylammonium Hydroxide;
OHS = a nonionic surfactant available from Arch Chemicals Inc.;
DI water = high purity deionized water
Note 2:
Lactic Acid was about 90 wt % active; TMAH (pH adjusting agent) was added as a 25 wt % aqueous solution.

Copper corrosion rates were measured by electrochemical testing according to General Procedure 3 with the cleaning composition held at a constant temperature setting of 50° C. and a linear polarization scan rate of 2 mV/sec. The working electrode was wafer coupon (a). Copper corrosion rates are listed in Table 3.

Cleaning tests were conducted using substrates containing a dielectric via array stack with exposed copper, porous low k material, TEOS and TiN layers. The stack also contained residue resulting from a fluoride-containing etch process and an oxygen plasma bulk resist removal process.

The wafers were initially surveyed by optical microscopy, and then diced into approximately 1×1 cm² square test coupons for the cleaning tests. The 1×1 cm² coupons were held using 4" long plastic locking tweezers, whereby the coupon could then be suspended into a 250 ml volume plastic beaker containing approximately 100 ml of the cleaning compositions of the present disclosure. Prior to immersion of the coupon into the cleaning composition, the composition was pre-heated to the test condition temperature of 50° C. with controlled stirring. The cleaning tests were then carried out by placing the coupon which was held by the plastic tweezers into the heated composition in such a way that the residue containing side of the coupon faced the stir bar. The coupon was left static in the cleaning composition for a period of 2 minutes while the composition was kept at the test temperature under controlled stirring. Once the coupon was exposed in the composition for the duration of the test, the coupon was gently removed from the cleaning composition and placed in a second 250 ml plastic beaker filled with approximately 150 ml of DI water at ambient temperature (~17° C.) with controlled stirring. The coupon was left in the beaker of DI water for approximately 20 seconds, and then gently removed, and placed into a second 250 ml plastic beaker also filled with approximately 150 ml of DI water at ambient temperature with controlled stirring. The coupon was left in the second rinse beaker for 60 seconds, and then removed. Upon removal, the coupon was immediately exposed to nitrogen gas stream from a hand held nitrogen blowing gun which caused any droplets on the coupon surface to be blown off the coupon, and further to completely dry the coupon device surface. Following this final nitrogen drying step, the coupon was removed from the plastic tweezers holder and placed into a covered plastic carrier with the device side up for short term storage no greater than about 2 hours. The test coupons were then lightly coated with a ~30 Angstrom thick layer of sputtered platinum, and scanning electron microscopy (SEM) images were collected for key features on the cleaned test coupon device surface. Cleaning results are listed in Table 3.

TABLE 3

Copper corrosion rates, and residue cleaning results

| Test Reference | Cu etch rate [Å/min] | Cu Corrosion Ranking* | Clean Ranking** | Overall Ranking*** |
|---|---|---|---|---|
| E1 | 0.6 | 9 | 10 | 9.5 |
| E2 | 0.5 | 10 | 9 | 9.5 |
| E3 | 0.7 | 9 | 9 | 9 |
| E4 | 0.4 | 10 | 10 | 10 |
| C1 | 2.8 | 5 | 5 | 5 |
| C2 | 5 | 1 | 6 | 3.5 |
| C3 | 12 | 1 | 7 | 4 |

*See General Procedure 2 for definition.
**Clean ratings were done on a scale form 1-10 with 10 being the best. Clean results were based on residue removal efficiency as observed on SEMs.
***Overall ratings are the average of copper corrosion ranking and clean ranking.

As can be seen from Table 3, all cleaning compositions that contained a carbazate component (Examples 1-4) clearly out performed the other compositions (Comparative Examples 1-3) in both substrate cleaning and copper corrosion rates.

Examples 5-6 and Comparative Examples 4-5

Examples 5-6 and Comparative Examples 4-5 were prepared using General Procedure 1 with cleaning compositions as listed in Table 4.

TABLE 4

Composition and pH of Examples 5-6 and Comparative Examples 4-5

| Solution Component | Examples 5-6 | | Comparative Examples 4-5 | |
|---|---|---|---|---|
| | E5 | E6 | C4 | C5 |
| Citric Acid | 40 g | 40 g | 40 g | 40 g |
| Lactic Acid | 11.1 g | 11.1 g | 11.1 g | 11.1 g |
| Me-Carb | 10 g | | | |
| Et-Carb | | 10 g | | |
| HAS | | | | 10 g |
| DI water | 938.9 g | 938.9 g | 948.9 g | 938.9 g |
| pH (@ 18° C.) | 2.73 | 2.64 | 1.86 | 1.94 |

See notes 1 and 2 from Table 2

Both copper and aluminum corrosion rates were measured using electrochemical testing according to General Procedure 3 with a constant temperature setting of 50° C. and a linear polarization scan rate of 2 mV/sec. The working electrode was wafer coupon (a) for the copper corrosion rate and (b) for the aluminum corrosion rate. Copper and aluminum corrosion rates are listed in Table 5.

Cleaning tests were conducted using substrates containing a dielectric stack with exposed Al-0.5% Cu lines as well as TiN, Ti and TEOS layers. The stack also contained residue resulting from a fluoride-containing etch process and an oxygen plasma bulk resist removal process. The testing process was similar to Examples 1-4 and Comparative Examples 1-3. The test condition temperature was held at 60° C. Aluminum residue cleaning results are listed in Table 5.

TABLE 5

Corrosion rates, and residue cleaning results

| Test Reference | Al etch rate [Å/min] | Cu etch rate [Å/min] | Clean Ranking** |
|---|---|---|---|
| E5 | 0.002 | 0.6 | 7 |
| E6 | 0.002 | 0.8 | 10 |
| C4 | 0.002 | 2.1 | 4 |
| C5 | 0.006 | 7.2 | 10 |

**see notes to table 2

Ethyl carbazate and HAS were highly effective in removing residue from the aluminum substrates. All measured aluminum corrosion rates were very low. However, only formulations containing the carbazate component can be employed as cleaning compositions for both aluminum and copper technologies with low substrate corrosion rates.

Examples 7-11 and Comparative Examples 6-8

Examples 7-11 and Comparative Examples 6-8 were prepared using General Procedure 2 with fluoride-containing cleaning compositions as listed in Table 6. Copper corrosion rates were measured using electrochemical testing according to General Procedure 3 with a constant temperature setting of 60° C.+/−2° C. and a linear polarization scan rate of 0.16 mV/sec. Results are also listed in Table 6

TABLE 6

Composition, pH and Copper Corrosion of Examples 7-11 and Comparative Examples 6-8

| Cleaner Component | E7 | E8 | E9 | E10 | E11 | C6 | C7 | C8 |
|---|---|---|---|---|---|---|---|---|
| Citric Acid (g) | 30 | 30 | 30 | 30 | 30 | 30 | 40 | 40 |
| 90% Lactic Acid sol. (g) | 33.33 | 33.33 | 33.33 | 33.33 | 33.33 | 33.33 | 11.11 | 11.11 |
| Me-Carbazate (g) | 10 | 2.5 | 10 | 10 | 10 | 0 | 0 | 0 |
| HAS (g) | 0 | 0 | 0 | 0 | 0 | 0.1 | 0 | 2.3 |
| 20% TMAF (g) | 2.5 | 2.5 | 2.5 | 2.5 | 2.5 | 2.5 | 2.5 | 10 |
| 25% TMAH (g) | 0 | 0 | 110.92 | 0 | 110.92 | 0 | 112.6 | 0 |
| OHS (g) | 0.1 | 0.1 | 0.1 | 0.01 | 0.01 | 0.1 | 0.01 | 0.01 |
| DI water (g) | 924.07 | 931.57 | 813.15 | 924.16 | 813.24 | 933.97 | 833.78 | 936.58 |
| pH and copper etch rates of fluoride-containing cleaning compositions | | | | | | | | |
| pH @ 18° C. | 2.7 | 2.2 | 4.0 | 2.7 | 4.0 | 2.0 | 4.0 | 2.2 |
| Cu Corrosion @ 60° C.(Å/min) | 1.0 | 1.0 | 2.0 | 1.0 | 1.8 | 1.2 | 1.5 | 3.8 |

Note 1:
Me-Carbazate = Methyl Carbazate;
HAS = Hydroxylammonium sulfate;
TMAF = Tetramethylammonium Fluoride;
TMAH = Tetramethylammonium Hydroxide;
OHS = a nonionic surfactant available from Arch Chemicals Inc.;
DI water = high purity deionized water Cleaning tests were conducted using copper technology based full 200 or 300 mm substrates containing dual damascene structures with exposed copper wiring. The un-cleaned device surface features of these substrates contained a significant amount of speckle type residue. The substrates were initially surveyed by optical microscopy, and then diced into approximately 1×1 cm² square test coupons for the cleaning tests. The 1×1 cm² coupons were placed device surface "up" on the bottom of a 200 ml plastic jar containing approximately 100 ml of a fluoride-containing cleaning composition. Prior to immersion of the coupon into the fluoride-containing cleaning composition, the fluoride-containing cleaning composition was pre-heated to the test condition temperature (typically 40° C. to 70° C.) within a shaker/water bath set at approximately 80 oscillations/second for controlled solution agitation. The cleaning tests were then carried out by placing the coupon "face up" into the heated fluoride-containing cleaning composition, and leaving the coupon in the fluoride-containing cleaning composition with constant agitation for the test condition time (typically 2 to 10 minutes). Once the coupon was exposed in the fluoride-containing cleaning composition for the duration of the test condition, the coupon was quickly removed from the test solution with a pair of plastic "locking" tweezers, and placed in a second 250 ml plastic beaker filled with approximately 200 mls of ultra pure deionized water at ambient temperature (approximately 17° C.). The coupon was left in the beaker of deionized water for approximately 10-15 seconds with mild agitation, and then removed and placed into a second 250 ml plastic beaker also filled with approximately 200 mls of ultra pure deionized water at ambient temperature. The coupon was left in the beaker for an additional 60 seconds with mild agitation, and then removed. Upon removal, the coupon was immediately exposed to nitrogen gas from a hand held nitrogen blowing gun which caused any droplets on the coupon surface to be blown off the coupon, and further to completely dry the coupon device surface and backside. Following this final nitrogen drying step, the coupon was removed from the plastic tweezers holder and placed into a covered plastic carrier with the device side up for short term storage no greater than about 2 hours. The test coupons were then lightly coated with an approximately 30-50 Angstrom thick layer of sputtered gold, and scanning electron microscopy (SEM) images were collected for key features on the cleaned test coupon device surface. Process conditions and results are listed in Table 7.

TABLE 7

Cleaning Results and Fluoride-Containing Cleaning Composition Ranking for Examples 7-11 and Comparative Examples 6-8

| Example | Cu Corrosion Ranking* | Clean rating** (2 min immersion @ 50° C.) | Clean rating** (4 min immersion @ 50° C.) | Clean rating** (2 min immersion @ 60° C.) | Overall Ranking*** |
|---|---|---|---|---|---|
| E7 | 9 | 4 | 10 | 10 | 6.5 |
| E8 | 9 | 4 | 10 | 10 | 6.5 |
| E9 | 7 | 3 | 10 | 6 | 5.0 |
| E10 | 9 | 10 | | | 9.5 |
| E11 | 7 | 8 | | | 7.5 |
| C6 | 8 | 7 | 10 | 10 | 7.5 |
| C7 | 8 | 2 | | | 5.0 |
| C8 | 3 | 10 | | | 6.5 |

*See General Procedure 3 for definition.
**Clean ratings were done on a scale form 1-10 with 10 being the best. Clean results were based on residue removal efficiency as observed on SEMs.
***Overall ratings are the average of copper corrosion ranking and clean ranking for 2 minute immersion @ 50° C.

It has been shown that hydrazinocarboxylic acid esters (carbazates) are an effective replacement for hydroxylamine type compounds in acidic fluoride-containing cleaning compositions. Methylcarbazate in combination with TMAF successfully cleaned the speckle type residue at low temperature and short processing times while keeping copper corrosion low. Fluoride-containing cleaning compositions formulated with carbazates are preferred as they are safer to use and more environmentally friendly than HAS containing compositions.

Examples 12-19 and Comparative Examples 9-10

Examples 12-20 and Comparative Example 9 were prepared using General Procedure 2 with fluoride-containing cleaning compositions as listed in Table 8.

TABLE 8

Fluoride-Containing Cleaning Compositions

| Example # | Carboxylic acid (g) | Carbazate (g) | Fluoride (g) | OHS (g) | Additive (g) | Water (g) | pH @ 22° C. |
|---|---|---|---|---|---|---|---|
| E12 | CA (30.0) LA (33.3) | MC (10.0) | NH$_4$F (1.2) | (5.0) | none | (920.4) | 2.7 |
| E13 | MA (30.0) DTPA (0.5) | MC (5.0) EC (5.0) | NH$_4$F (1.2) | (5.0) | none | (953.3) | 2.4 |
| E14 | MA (30.0) Glyc. (10) | EC (10.0) | TMAF (2.5) | (5.0) | none | (942.5) | 2.4 |
| E15 | MA (30.0) Glycine (10) | EC (10.0) | NH$_4$F (1.2) | (5.0) | none | (943.8) | 2.4 |
| E16 | MA (30.0) | EC (10.0) | NH$_4$F (0.6) TMAF (1.3) | (5.0) | Ascorb. (10.0) TMAH (5.0) | (938.1) | 2.4 |
| E17 | GA (63.2) Malic (10.0) DTPA (0.5) | MC (5.0) EC (5.0) | NH$_4$F (1.2) | (5.0) | none | (910.1) | 3.2 |
| E18 | CA (30.0) GlycA (42.9) | MC (10.0) | TMAF (2.5) | (5.0) | none | (909.6) | 2.7 |
| E19 | CA (30.0) LA (33.3) | MC (10.0) | TMAF (2.5) | (5.0) | none | (919.2) | 2.75 |
| C9 | CA (30.0) LA (33.3) | MC (10.0) | none | (5.0) | none | (921.7) | 2.7 |
| C10 | CA (50.0) | none | none | none | TEA (600.0) DMSO (250.0) | (100) | 11.5 |

Note:
MC = Methyl Carbazate;
EC = Ethyl Carbazate;
CA = Citric Acid;
LA = 90% Lactic acid;
MA = Malonic Acid;
DTPA = Diethylenetriaminepentaacetic Acid;
Malic = Malic Acid;
Ascorb. = Ascorbic Acid;
GA = Gluconic Acid;
GlycA = Glycolic Acid;
NH$_4$F = 40.6% Ammonium Fluoride;
TMAF = 20% Tetramethylammonium Fluoride;
TMAH = 25% Tetramethylammonium Hydroxide;
OHS = 0.2% nonionic surfactant available from Arch Chemicals Inc.;

Cleaning tests were conducted using copper technology based full 200 mm substrates containing via test structures. The stack contained Si, SiO$_2$, SiC, Black Diamond II and TiN hardmask layers as well as residues form a bulk resist removal (plasma ash) process. The un-cleaned device surface features of these substrates contained a significant amount of sidewall polymer type residue. The testing process was similar to Examples 7-11 and Comparative Examples 6-8. The fluoride-containing cleaning compositions were held at a constant temperature of 70° C. while the coupon coupons were immersed into the fluoride-containing cleaning compositions for 10 minutes. SEMs were evaluated for how much sidewall residue was removed and over etch of the hardmask. Process conditions and results are listed in Table 9.

TABLE 7

Cleaning Results and Fluoride-Containing Cleaning Composition Ranking

| Example | pH | Cleaning Rank[1] | Over etch of hardmask |
|---|---|---|---|
| E12 | 2.7 | 10 | Slight |
| E13 | 2.4 | 7 | Very Slight |
| E14 | 2.4 | 10 | Very Slight |
| E15 | 2.4 | 10 | Very Slight |
| E16 | 2.4 | 9 | None |
| E17 | 3.1 | 9 | Slight |
| E18 | 2.7 | 9 | None |
| E19 | 2.7 | 10 | None |
| C9 | 2.7 | 0 | None |
| C10 | 11.5 | 0 | None |

[1]Rank:
10 [best] Represents complete removal of sidewall residue and 100% reveal of hardmask/dielectric interface.
5 [middle] Represents ~50% sidewall residue removal and reveal of hardmask/dielectric interface.
0 [worst] Represents 0% sidewall residue removal and no visible hardmask/dielectric interface.

The addition of fluoride clearly improved the ability to remove the sidewall residue of the fluoride-containing cleaning composition of the present disclosure. This was accomplished without degrading the dielectric or the hardmask significantly.

While the present disclosure has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

What is claimed is:
1. A cleaning composition comprising:
   water;
   at least one water soluble hydrazinocarboxylic acid ester;
   at least one water soluble carboxylic acid;
   optionally, at least one water soluble fluoride-containing material; and optionally, at least one corrosion inhibitor not containing carboxyl groups.

2. The cleaning composition of claim 1, wherein the pH of the cleaning composition is between about 2 and about 6.

3. The cleaning composition of claim 1, further comprising an additive selected from a group consisting of: surfactants, de-foaming agents, biocides, and any combinations thereof.

4. The cleaning composition of claim 1, wherein said water soluble hydrazinocarboxylic acid ester has the following formula (I):

$$R^1-O-CO-NH-NH_2 \qquad (I)$$

wherein, R' is a straight-chain or branched $C_1$-$C_{20}$ alkyl group, a $C_3$-$C_{20}$ cycloalkyl group, or a $C_6$-$C_{14}$ aryl group.

5. The cleaning composition of claim 4, where $R^1$ is selected from a group consisting of: methyl, trifluoromethyl, ethyl, 2,2,2-trifluoroethyl, 2,2,2-trichloroethyl, hydroxyethyl, propyl, iso-propyl, cyclopropyl, n-butyl, iso-butyl, tert-butyl, sec-butyl, cyclobutyl, pentyl, 1-hydroxypentyl, iso-pentyl, neo-pentyl, cyclopentyl, hexyl, cyclohexyl, heptyl, cyclohexylmethyl, cycloheptyl, 2-cyclohexylethyl, octyl, decyl, pentadecyl, eicosyl, benzyl, phenyl, or and any combinations thereof.

6. The cleaning composition of claim 4, where $R^1$ is a straight-chain $C_1$-$C_{10}$ alkyl group, branched $C_1$-$C_{10}$ alkyl group, or $C_3$-$C_{10}$ cycloalkyl group.

7. The cleaning composition of claim 4, wherein said water soluble hydrazinocarboxylic acid ester is at least one selected from the group consisting of: methyl carbazate, ethyl carbazate, propyl carbazate, iso-propyl carbazate, butyl carbazate, tert-butyl carbazate, pentyl carbazate, decyl carbazate, pentadecyl carbazate, eicosyl carbazate, benzyl carbazate, phenyl carbazate and 2-hydroxyethyl carbazate.

8. The cleaning composition of claim 7, wherein said water soluble hydrazinocarboxylic acid ester is at least one selected from the group consisting of: methyl carbazate, ethyl carbazate, tert-butyl carbazate, and benzyl carbazate.

9. The cleaning composition of claim 1, wherein said water soluble hydrazinocarboxylic acid ester is present in an amount from about 0.01 wt % to about 15 wt % of the cleaning composition.

10. The cleaning composition of claim 9, wherein the water soluble hydrazinocarboxylic acid ester is present in an amount from about 0.1 wt % to about 5 wt % of the cleaning composition.

11. The cleaning composition of claim 1, wherein the water soluble hydrazinocarboxylic acid ester is a binary mixture of two water soluble hydrazinocarboxylic acid esters, blended in a ratio of up to 99 wt % of one of said water soluble hydrazinocarboxylic acid esters.

12. The cleaning composition of claim 11, wherein said binary mixture of two water soluble hydrazinocarboxylic acid esters is blended in a ratio of up to 95 wt % of one of said water soluble hydrazinocarboxylic acid esters.

13. The cleaning composition of claim 12, wherein said binary mixture of two water soluble hydrazinocarboxylic acid esters is blended in a ratio of up to 75 wt % of one of said water soluble hydrazinocarboxylic acid esters.

14. The cleaning composition of claim 13, wherein said binary mixture of two water soluble hydrazinocarboxylic acid esters is blended in a ratio of up to 50 wt % of one of said water soluble hydrazinocarboxylic acid esters.

15. The cleaning composition of claim 1, wherein said water soluble carboxylic acid is at least one selected from the group consisting of: monocarboxylic acids with one additional ligand, monocarboxylic acids with two or more additional ligands, dicarboxylic acids with one additional ligand, dicarboxylic acids with two or more additional ligands, and polycarboxylic acids with additional ligands.

16. The cleaning composition of claim 15, wherein said water soluble carboxylic acid is at least one selected from the group consisting of: monocarboxylic acids with one additional ligand, monocarboxylic acids with two or more additional ligands, and polycarboxylic acids with additional ligands.

17. The cleaning composition of claim 1, wherein said water soluble carboxylic acid is present in an amount from about 0.01 wt % to about 20 wt % of the composition.

18. The cleaning composition of claim 17, wherein said water soluble carboxylic acid is present in an amount from about 0.1 wt % to about 6 wt % of the composition.

19. The cleaning composition of claim 1, wherein said corrosion inhibitor not containing carboxyl groups is present in an amount from about 0.001 wt % to about 15 wt % of the composition.

20. The cleaning composition of claim 19, wherein said corrosion inhibitor not containing carboxyl groups is present in an amount from about 0.01 wt % to about 6 wt % of the composition.

21. The cleaning composition of claim 1, wherein said water soluble fluoride-containing material is selected from the group consisting of: ammonium fluoride, tetramethylammonium fluoride, tetraethylammonium fluoride, tetrabutylammonium fluoride or trimethylethyl ammonium fluoride, or trimethylethanolammonium fluoride.

22. The cleaning composition of claim 21, wherein said water soluble fluoride-containing material is selected from the group consisting of: tetramethylammonium fluoride, tetrabutylammonium fluoride or trimethylethyl ammonium fluoride.

23. The cleaning composition of claim 1, wherein said water soluble fluoride-containing material is present in an amount from about 0.0005 wt % to about 5 wt % of the composition.

24. The cleaning composition of claim 23, wherein said water soluble fluoride-containing material is present in an amount from about 0.05 wt % to about 1.5 wt % of the composition.

25. A cleaning composition, comprising:
water;
at least one water soluble hydrazinocarboxylic acid ester selected from the group consisting of: methyl carbazate, ethyl carbazate, tert-butyl carbazate, and benzyl carbazate;
at least one water soluble carboxylic acid selected from the group consisting of: monocarboxylic acids with one additional ligand, monocarboxylic acids with two or more additional ligands, and polycarboxylic acids with additional ligands;
at least one water soluble fluoride-containing material selected from the group consisting of: tetramethylammonium fluoride, tetrabutylammonium fluoride, and trimethylethyl ammonium fluoride; and
optionally, at least one corrosion inhibitor not containing carboxyl groups.

26. A cleaning composition, comprising:
water;
about 0.01 wt % to about 15 wt % of at least one water soluble hydrazinocarboxylic acid ester;
about 0.01 wt % to about 20 wt % of at least one water soluble carboxylic acid;
about 0.0005 wt % to about 5 wt % of at least one water soluble fluoride-containing material; and optionally, at least one corrosion inhibitor not containing carboxyl groups.

27. The cleaning composition of claim 26, wherein said corrosion inhibitor not containing carboxyl groups is present in an amount from about 0.001 wt % to about 15 wt % of the composition.

28. A method of cleaning residues from a semiconductor substrate, the method comprising the steps of:
providing a semiconductor substrate;
contacting said semiconductor substrate with a cleaning composition, said cleaning composition comprising water, at least one water soluble hydrazinocarboxylic acid ester, at least one water soluble carboxylic acid, optionally, at least one water soluble fluoride-containing compound, and, optionally, at least one corrosion inhibitor not containing a carboxyl group;
rinsing said semiconductor substrate with a suitable rinse solvent; and
optionally, drying said semiconductor by any means that removes the rinse solvent and does not compromise the integrity of said semiconductor substrate.

29. The method of claim 28, wherein said semiconductor substrate contains post etch and/or post ash residues.

30. The method of claim 28, wherein said semiconductor substrate contains post-chemical mechanical polishing residues.

31. The method of claim 28, wherein the method of cleaning is conducted at a temperature of about 16° C. to about 70° C.

32. A method of cleaning residues from a semiconductor substrate, the method comprising the steps of:
providing a semiconductor substrate;
contacting said semiconductor substrate with a cleaning composition;
rinsing said semiconductor substrate with a suitable rinse solvent; and
optionally, drying said semiconductor by any means that removes the rinse solvent and does not compromise the integrity of said semiconductor substrate,
wherein said cleaning composition comprises:
water;
at least one water soluble hydrazinocarboxylic acid ester selected from the group consisting of: methyl carbazate, ethyl carbazate, tert-butyl carbazate, and benzyl carbazate;
at least one water soluble carboxylic acid selected from the group consisting of: monocarboxylic acids with one additional ligand, monocarboxylic acids with two or more additional ligands, and polycarboxylic acids with additional ligands;
at least one water soluble fluoride-containing material selected from the group consisting of: tetramethylammonium fluoride, tetrabutylammonium fluoride and trimethylethyl ammonium fluoride, and
optionally, at least one corrosion inhibitor not containing a carboxyl group.

33. A cleaning composition comprising:
water;
at least one water soluble hydrazinocarboxylic acid ester;
at least one water soluble carboxylic acid;
at least one water soluble fluoride-containing material; and
optionally, at least one corrosion inhibitor not containing carboxyl groups.

34. A cleaning composition comprising:
at least about 45 wt % of water;
at least one water soluble hydrazinocarboxylic acid ester;
at least one water soluble carboxylic acid;
optionally, at least one water soluble fluoride-containing material; and
optionally, at least one corrosion inhibitor not containing carboxyl groups.

* * * * *

UNITED STATES PATENT AND TRADEMARK OFFICE
CERTIFICATE OF CORRECTION

| | | |
|---|---|---|
| PATENT NO. | : 7,947,637 B2 | Page 1 of 1 |
| APPLICATION NO. | : 11/770382 | |
| DATED | : May 24, 2011 | |
| INVENTOR(S) | : Emil Kneer | |

It is certified that error appears in the above-identified patent and that said Letters Patent is hereby corrected as shown below:

Title page, Item [56] Col. 2, Line 4 (Other Publications)
Delete "97810054.2." and insert -- 07810054.2 --, therefor.

Column 29, Line 13, Claim 4
In Claim 4, delete "R'" and insert -- $R^1$ --, therefor.

Signed and Sealed this
Thirteenth Day of September, 2011

David J. Kappos
*Director of the United States Patent and Trademark Office*